United States Patent
Heydari

(10) Patent No.: US 11,212,943 B2
(45) Date of Patent: Dec. 28, 2021

(54) UNIVERSAL PLUGGABLE DATACENTER COOLING SYSTEM

(71) Applicant: Nvidia Corporation, Santa Clara, CA (US)

(72) Inventor: Ali Heydari, Albany, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 16/798,214

(22) Filed: Feb. 21, 2020

(65) Prior Publication Data

US 2021/0267096 A1    Aug. 26, 2021

(51) Int. Cl.
*H05K 7/20* (2006.01)
*H05K 7/14* (2006.01)

(52) U.S. Cl.
CPC ....... *H05K 7/20781* (2013.01); *H05K 7/1488* (2013.01); *H05K 7/20254* (2013.01)

(58) Field of Classification Search
None
See application file for complete search history.

(56) References Cited

U.S. PATENT DOCUMENTS

| | | | |
|---|---|---|---|
| 9,025,330 B2 * | 5/2015 | Hodes | H05K 7/20609 361/698 |
| 10,136,551 B2 * | 11/2018 | Branton | H05K 7/20263 |
| 10,225,958 B1 | 3/2019 | Gao | |
| 2007/0121294 A1 | 5/2007 | Campbell | |
| 2007/0227710 A1 * | 10/2007 | Belady | H05K 7/2079 165/122 |
| 2007/0297136 A1 * | 12/2007 | Konshak | F28F 13/00 361/699 |
| 2010/0101759 A1 * | 4/2010 | Campbell | H05K 7/20772 165/80.4 |
| 2010/0101765 A1 * | 4/2010 | Campbell | H05K 7/20809 165/104.33 |
| 2013/0138252 A1 | 5/2013 | Chainer | |
| 2014/0068943 A1 * | 3/2014 | Campbell | B21D 53/02 29/890.035 |
| 2016/0113149 A1 | 4/2016 | Krug | |
| 2018/0242478 A1 | 8/2018 | Cui | |
| 2018/0299933 A1 * | 10/2018 | Cui | H05K 7/20781 |
| 2018/0324976 A1 * | 11/2018 | Gao | H05K 7/2079 |

OTHER PUBLICATIONS

*Water-Cooled Servers* [Ashrae Technical Committee 9.9] Oct. 15, 2019—50 pgs.
Quesenal, Norman; *What Fluids Can Be Used With Liquid Cold Plates in Electronics Cooling Systems* [Advanced Thermal Solutions, Inc.] Nov. 13, 2017—5 pgs.
Combined Search and Examination Report issued in GB Application No. GB2102337.9, dated Jul. 27, 2021.

* cited by examiner

*Primary Examiner* — Courtney L Smith
(74) *Attorney, Agent, or Firm* — Hogan Lovells US LLP

(57) ABSTRACT

A datacenter cooling system is disclosed. The system includes a first cooling loop with a heat exchanger to exchange heat with a second cooling loop. The second cooling loop includes a cooling distribution unit (CDU) to exchange heat between the second cooling loop and a primary cooling loop.

20 Claims, 7 Drawing Sheets

UNIVERSAL PLUGGABLE DATACENTER COOLING SYSTEM

FIELD

At least one embodiment pertains to cooling systems for a datacenter. In at least one embodiment, a cooling system includes a first cooling loop with a heat exchanger to exchange heat with a second cooling loop, and the second cooling loop includes a cooling distribution unit (CDU) to exchange heat between the second cooling loop and a primary cooling loop, according to various novel techniques described herein.

BACKGROUND

Datacenter cooling systems typically use fans to circulate air through server components. Certain supercomputers or other high capacity computers may use water or other cooling systems than air cooling systems to draw heat away from the server components or racks of the datacenter to an area external to the datacenter. The cooling systems may include a chiller within the datacenter area. The area external to the datacenter may be a cooling tower that receives heated coolant from the datacenter and disperses the heat by forced air or other means to the environment (or an external cooling medium) before the cooled coolant is recirculated back into the datacenter. In an example, chiller and cooling tower together form a chilling facility with pumps. Air cooling systems do not draw sufficient heat to support effective or efficient cooling in datacenters and liquid cooling systems are capable of significantly damaging server components or racks by electrical shorting, flooding, or other issues.

BRIEF DESCRIPTION OF THE DRAWINGS

Various embodiments in accordance with the present disclosure will be described with reference to the drawings, in which.

DETAILED DESCRIPTION

Figure 1:
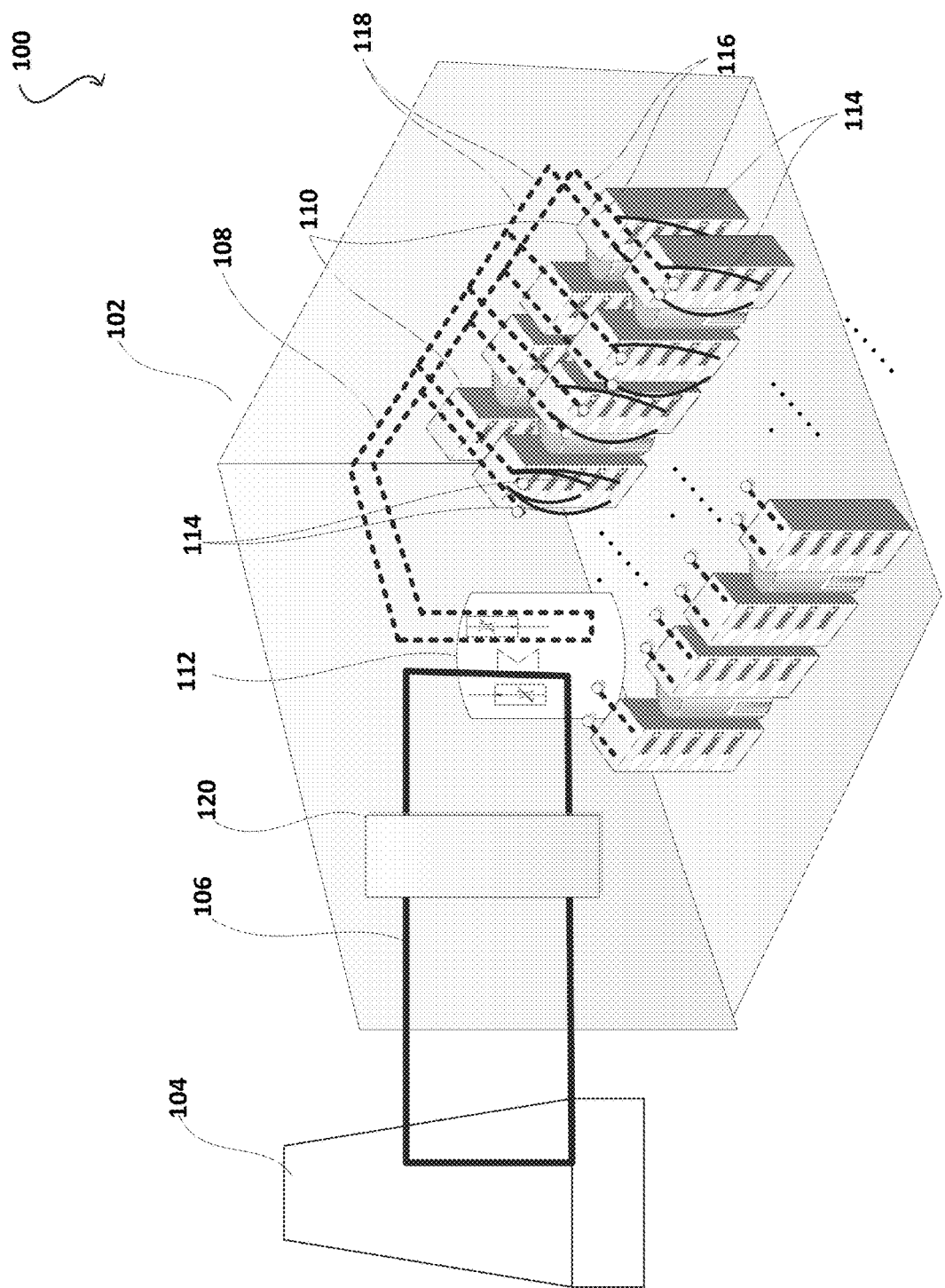
FIG. 1 is a block diagram of an example datacenter having a cooling system subject to improvements described in at least one embodiment.

Air cooling of high density servers is inefficient and ineffective in view of the high heat requirements caused by present day computing components. As such, the present disclosure seeks prospects in liquid coolants (or working cooling fluid) and associated systems for cooling computing components such as a graphics processing unit (GPU), a central processing unit (CPU), or switching components. These computing components are used in servers assembled in server trays on racks in a datacenter. As the computing components are miniaturized by technology advances, the server trays and the racks accommodate more and more computing components, thereby requiring dissipation of more heat generated per component than in prior systems. One issue addressed in the present disclosure is a lack of universality that may be applied to requirements in liquid cooled systems—e.g., determining a cooling fluid or coolant to be used, determining wetted materials (such as valves, piping, manifolds, etc.) to enable liquid cooling, and determining location of plumbing required for the liquid cooling systems within a server, a rack, and the datacenter. Such requirements complicate design, serviceability and reliability of the liquid cooled computing components and electrical components in the datacenters.

The present disclosure addresses the above and other issues in an all-internal-liquid cooling system for electrical and computing components of a liquid-cooled datacenter. In at least one embodiment, the present disclosure enables a universal integrated pluggable mezzanine module that is ruggedly built to required rack or server tray specifications and that may be a single module that can contain a universal coolant. The present disclosure provides connections, manifolds, plumbing, and heat transfer examples to enable the universal integrated pluggable mezzanine module that operates between at least one existing cooling loop with an additional cooling loop that is maintained even when computing or electrical components are changed in a server tray or rack. In an example, the additional cooling loop is a universal cooling loop with a universal coolant that is adapted to work under a combination of different temperature dissipation requirements (stated by component manufacturers, for instance), that incorporates a heat exchanger to transfer heat to the at least one existing cooling loop, which in turn utilizes a cooling distribution unit (CDU) to transfer heat to a loop that exits the datacenter to a cooling tower. Single or multiphase cold plates may be further adapted with couplers or may be used or replaced by the pluggable mezzanine module enabled by couplers on the module. The couplers enable pluggable cold plate heads, for instance, to transfer cooling liquid or coolant to the heat transfer elements attached to the liquid-cooled electronics components. This additional cooling loop connects through an indirect contact heat exchanger to the rack or may be located within the rack or a server tray.

In at least one embodiment, the present disclosure enables a cooling system in which there is no visible liquid cooling tubing. Instead, the flexible tubing may be integrated into the pluggable liquid cooling unit. A snap-in connection is provided via rack cooling manifolds to couple with row or room manifolds. Further, a similar snap-in connection may be provided on server trays to couple to the rack cooling manifolds and to provide coolant to computing components such as GPUs, CPUs, switches, or other heat slugs. The server trays and/or the rack cooling manifolds are enabled as part of the additional cooling loop (or universal cooling loop) that includes a universal coolant. The server tray may be formed as a mezzanine module with variety of liquid cooling heat dissipation modules attached thereon to further dissipate heat from the computing and electronic components. As the coolant is located inside the pluggable module (either one or more of the server tray and the rack cooling manifold) and as the pluggable module is part of the universal cooling loop that is a closed loop, exchange of heat from the universal cooling loop to a second cooling loop may be enabled by an indirect contact heat exchanger. Such a system eliminates requirements for system-specific wetted material.

FIG. 1 is a block diagram of an example datacenter 100 having a cooling system subject to improvements described in at least one embodiment. The datacenter 100 may be one or more rooms 102 having racks 110 and auxiliary equipment to house one or more servers on one or more server trays. The datacenter 100 is supported by a cooling tower 104 located external to the datacenter 100. The cooling tower 104 dissipates heat from within the datacenter 100 by acting on a primary cooling loop 106. Further, a cooling distribution unit (CDU) 112 is used between the primary cooling loop 106 and a second cooling loop 108 to enable extraction of the heat from the second cooling loop 108 to the primary cooling loop 106. The second cooling loop 108 is able to access various plumbing all the way into the server tray as required, in an aspect. The loops 106, 108 are illustrated as line drawings, but a person of ordinary skill would recognize that one or more plumbing features may be used. In an instance, flexible polyvinyl chloride (PVC) pipes may be used along with associated plumbing to move the fluid along in each of the loops 106, 108. Other flexible hosing material may include at least or one or more of Polytetrafluoroethylene (PTFE), ethylene propylene diene monomer (EPDM), nitrile rubber (NBR), Fluorinated ethylene propylene (FEP), fluoroelastomer (FKM), polyurethane, and nylon. One or more coolant pumps, for example, may be used to maintain pressure differences within the loops 106, 108 to enable the movement of the coolant.

In at least one embodiment, the coolant in the primary cooling loop 106 and in the second cooling loop 108 may be one or more of: a dielectric fluid alone (e.g., not having water for purposes of this disclosure) or a water in combination with an additive including at least one dielectric fluid, such as or one or more of de-ionized water, ethylene glycol, and propylene glycol. In at least one embodiment, in operation, each of the primary and the second cooling loops has their own coolant. In an aspect, the coolant in the second cooling loops may be proprietary to the components in the server tray or racks 110. As such, it may be required to change the coolant in the second cooling loop 108, when components are switched out of the rack 110. The CDU 112 is capable of sophisticated control of the coolants, independently or concurrently, in the loops 106, 108. For instance, the CDU may be adapted to control the flow rate so that the coolant(s) is appropriately distributed to extract heat generated within the racks 110. Further, more flexible tubing 114 is provided from the second cooling loop 108 to enter each server tray and to provide coolant to the electrical and/or computing components. In the present disclosure, the electrical and/or computing components are used interchangeably to refer to the heat-generating components that benefit from the present datacenter cooling system. The tubing 118 that form part of the second cooling loop 108 may be referred to as room manifolds. Separately, the tubing 116 extending from tubing 118 may also be part of the second cooling loop 108 but may be referred to as row manifolds. The tubing 114 enters the racks as part of the second cooling loop 108, but may be referred to as rack cooling manifold. Further, the row manifolds 116 extend to all racks along a row in the datacenter 100. The plumbing of the second cooling loop 108, including the manifolds 118, 116, and 114 may be improved by at least one embodiment of the present disclosure. An optional chiller 120 may be provided in the primary cooling loop within datacenter 102 to support cooling before the cooling tower. To the extent additional loops exist in the primary control loop, a person of ordinary skill would recognize reading the present disclosure that the additional loops provide cooling external to the rack and external to the second cooling loop; and may be taken together with the primary cooling loop for this disclosure.

In at least one embodiment, in operation, heat generated within server trays of the racks 110 may be transferred to a coolant exiting the racks 110 via flexible tubing of the row manifold 114 of the second cooling loop 108. Pertinently, second coolant (in the second cooling loop 108) from the CDU 112, for cooling the racks 110, moves towards the racks 110. The second coolant from the CDU 112 passes from on one side of the room manifold having tubing 118, to one side of the rack 110 via row manifold 116, and through one side of the server tray via tubing 114. Spent second coolant (or exiting second coolant carrying the heat from the computing components) exits out of another side of the server tray (e.g., enter left side of the rack and exits right side of the rack for the server tray after looping through the server tray or through components on the server tray). The spent second coolant that exits the server tray or the rack 110 comes out of different side (e.g., exiting side) of tubing 114 and moves to a parallel, but also exiting side of the row manifold 116. From the row manifold 116, the spent second coolant moves in a parallel portion of the room manifold 118 going in the opposite direction than the incoming second coolant (which may also be the renewed second coolant), and towards the CDU 112. In the CDU 112, in at least one embodiment, the spent second coolant exchanges its heat with a primary coolant in the primary cooling loop 106. The spent second coolant is renewed (e.g., relatively cooled when compared to the temperature at the spent second coolant stage) and ready to be cycled back to through the second cooling loop 108 to the computing components. Various flow and temperature control features in the CDU 112 enable control of the heat exchanged from the spent second coolant or enable control of the flow of the renewed second coolant in and out of the CDU 112. The CDU 112 is also able to control a flow of the primary coolant in primary cooling loop 106. As such, it is possible that the renewed second coolant may be fully cooled may not be fully cooled to its default temperature properties before being circulated to the racks 110.

Figure 2:
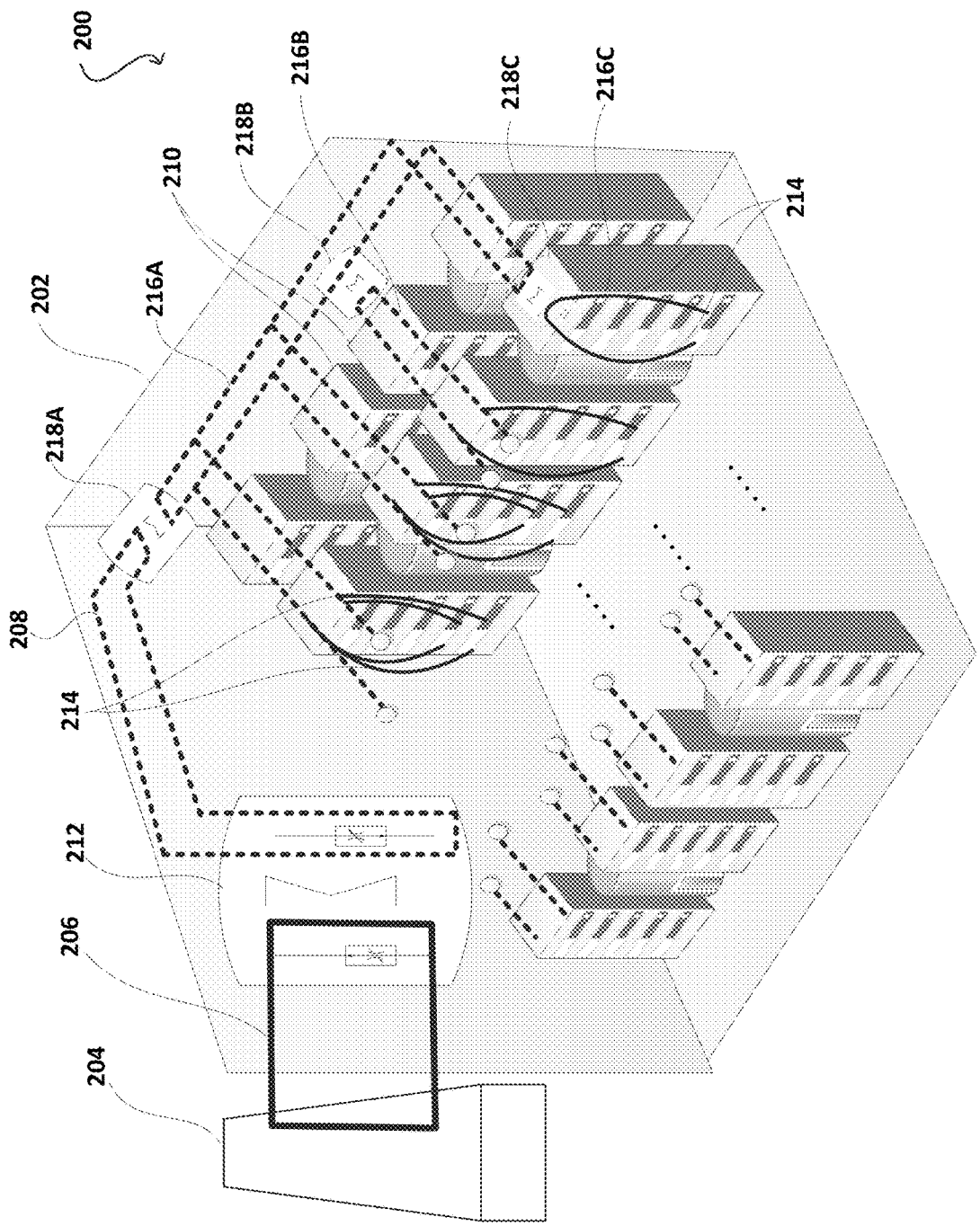
FIG. 2 is a block diagram of another example datacenter having an improved cooling system incorporating a first cooling loop in addition to a primary and a second cooling loops as described in at least one embodiment.

FIG. 2 is a block diagram of an example datacenter 200 having an improved cooling system incorporating a first cooling loop 216A; 216B; 216C in addition to a primary 206 and a second 208 cooling loops, as described in at least one embodiment. Further, the first cooling loop 216A; 216B; 216C may have a universal coolant that is distinct from the coolants used in the primary and the second cooling loops. In an example, the coolant in the first cooling loop 216A; 216B; 216C may be water or dielectric fluid different from the dielectric fluid of the primary and the second cooling loops. The different reference numerals A-C for the first cooling loop 216 is intended to provide different embodiments that may be combined in any manner appreciated by a person of ordinary skill reading the present disclosure. For example, multiple first cooling loops may be provided over the second and the primary cooling loops. Alternatively, only one of the three different first cooling loops 216A-C may be used at any point in time.

In at least one embodiment, first cooling loop 216A; 216B; 216C includes a heat exchanger 218A; 218B; 218C.

The heat exchanger 218A; 218B; 218C is a passive heat exchanging component that may not be adapted for controlling flow and temperature of the coolant. While the heat exchanger may include a pump, it has no intelligent control features. A reference to a heat exchanger in the present disclosure, unless noted otherwise, is a reference to a passive heat exchanger. In a distinct embodiment, a heat exchanger may be provided with limited intelligent control, such as variable outlet pumps; in which case, this alternate heat exchanger is distinct from a passive heat exchanger and is applicable in certain embodiments requiring an active heat exchanger.

In at least one embodiment, the first cooling loop 216A-C includes the heat exchanger for efficient and effective operation that supports the universality of the present disclosure. As previously noted, in at least one distinct embodiment, than the heat exchanger (or passive heat exchanger), the first cooling loop may include the active heat exchanger for different operations than merely universality offered by the passive heat exchanger. Nonetheless, the application requirements and understanding of the universality requirements may enable selection between the two. In comparison to the heat exchanger, whether active or passive, a CDU 212 is able to control and monitor flow and temperature of the coolant between the second and the primary cooling loops 208, 206. A heat exchanger, whether active or passive, may be distinguished from the CDU by an inability of the heat exchanger to perform all the functions of a CDU in a cooling loop other than the first cooling loop, for instance. Further, the first cooling loop may be located at the room-level (e.g., via room manifolds 216A), at the row-level (e.g., row manifolds 216B), or at the rack or server level via tubing 214 or manifolds 216C.

In at least one embodiment, the datacenter 200, as in the case of the datacenter 100 of FIG. 1, may be one or more rooms 202 having racks 210 and auxiliary equipment to house one or more servers on one or more server trays. The datacenter 200 is supported by a cooling tower 204 (or a chilling facility) located external to the datacenter 200. The cooling tower 204 dissipates heat from within the datacenter 200 by acting on a primary cooling loop 206. Further, a cooling distribution unit (CDU) 212 is used between the primary cooling loop 206 and a second cooling loop 208 to enable extraction of the heat from the second cooling loop 208 to the primary cooling loop 206. The second cooling loop 208 is able to access various plumbing to interface with at least one heat exchanger 218A; 218B; 218C of the first cooling loop 216A; 216B; 216C. The first cooling loop 216A; 216B; 216C accesses plumbing all the way into the server tray as required, in an aspect.

In at least one embodiment, in operation, heat generated within server trays of the racks 210 may be transferred to a coolant exiting the racks 210 via flexible tubing 214 or manifolds 216C to the row manifold 216A of the first cooling loop. Pertinently, the coolant from the CDU 212 moves towards the racks 210. The coolant from the CDU 212 passes from on one side of the room manifold 208, via heat exchanger 218A, to the first cooling loop 216A. In a different aspect, if the first cooling loop is at the row-level, the coolant from the CDU 212 passes from on one side of the room manifold 208, 216A, via heat exchanger 218B, to the first cooling loop 216B. In yet another aspect, if the first cooling loop is at the rack-level, the coolant from the CDU 212 passes from on one side of the room manifold 208, 216A, 216B, via heat exchanger 218C, to the first cooling loop 216C. In a further aspect, the heat exchanger 218C at the rack-level may be located as mezzanine module or elsewhere within the rack. Possible locations for mounting the heat exchanger 218C within the rack are supported by the discussion and illustrations of FIGS. 3A-D.

In at least one embodiment, further in the operation, the coolant in tubing 208 (of the second cooling loop) exchanges heat at heat exchanger 218A (room-level first cooling loop), at heat exchanger 218B (row-level first cooling loop), or at heat exchanger 218C (rack-level first cooling loop). First or universal coolant, as previously noted, then circulates in the first cooling loop at the room, row, or rack-level to the server trays. In an example, the universal coolant of the first cooling loop moves through room-level manifold 216A of the room-level first cooling loop. The universal coolant continues through to the rack 210 via row manifold 216B (still assuming the room-level first cooling loop). Further, from the row manifold 216B, the universal coolant moves to one side of the server tray via tubing 214.

In at least one embodiment, spent universal coolant (or exiting universal coolant carrying the heat from the computing components) exits out of another side of the server tray (e.g., enter left side of the rack and exits right side of the rack for the server tray after looping through the server tray or through components on the server tray). The spent universal coolant that exits the server tray or the rack 210 comes out of different side (e.g., exiting side) of tubing 214 and moves to a parallel, but also exiting side of the row manifold 216C. While reference is made to a spent universal coolant, one or ordinary skill would understand that the spent universal coolant may be still capable of receiving more heat from other components as it travels through the rack. This may be the case with coolants of the primary and second cooling loops as well. Still assuming a room-level first cooling loop application, the spent universal coolant from the row manifold 216C moves in a parallel portion of the room manifold 216A going in the opposite direction than the incoming coolant, and towards the heat exchanger 218A for exchanging its heat with the second cooling loop 208. Once heat from the spent universal coolant is transferred to a second coolant of the second cooling loop 208, the universal coolant is renewed (cooled at least relative to the exiting universal coolant temperature) and recirculated in the room-level first cooling loop to the server trays.

In at least one embodiment, the second coolant of the second cooling loop 208, however, is heated and considered spent second coolant as it moves to the CDU 112. This spent second coolant of the second cooling loop 208 exchanges its heat with a primary coolant of the primary cooling loop 206. The spent second coolant is, therefore, renewed (e.g., cooled relative to its temperature at the spent second coolant stage) and ready to be cycled back to through the second cooling loop 208 to the heat exchanger 218A (or to heat exchanger 218B of a row-level first cooling loop aspect, or to a heat exchanger 218C of a rack-level first cooling loop aspect). Various flow and temperature control features in the CDU 212 enable control of the heat exchanged from the spent second coolant or the rate of the heat exchanged (e.g., by controlling the flow of the spent second coolant in relation to the flow of the primary coolant that is intended to cool the spent second coolant). In addition, the CDU 212 may also control the movement of the renewed second coolant in and out of the CDU 212 to enable slower or faster dissipation of the heat from the second coolant. Alternatively or concurrently, in at least one embodiment, it is possible to control movement and temperature of the second coolant by controlling flow of the primary coolant of the primary cooling loop 206. For example, faster circulation of the primary coolant draws more heat away from the spent second coolant of the second cooling loop 208. As such, the renewed second coolant may be fully cooled or may not be fully cooled to its default temperature properties before being circulated to the racks 210.

Figure 3A:
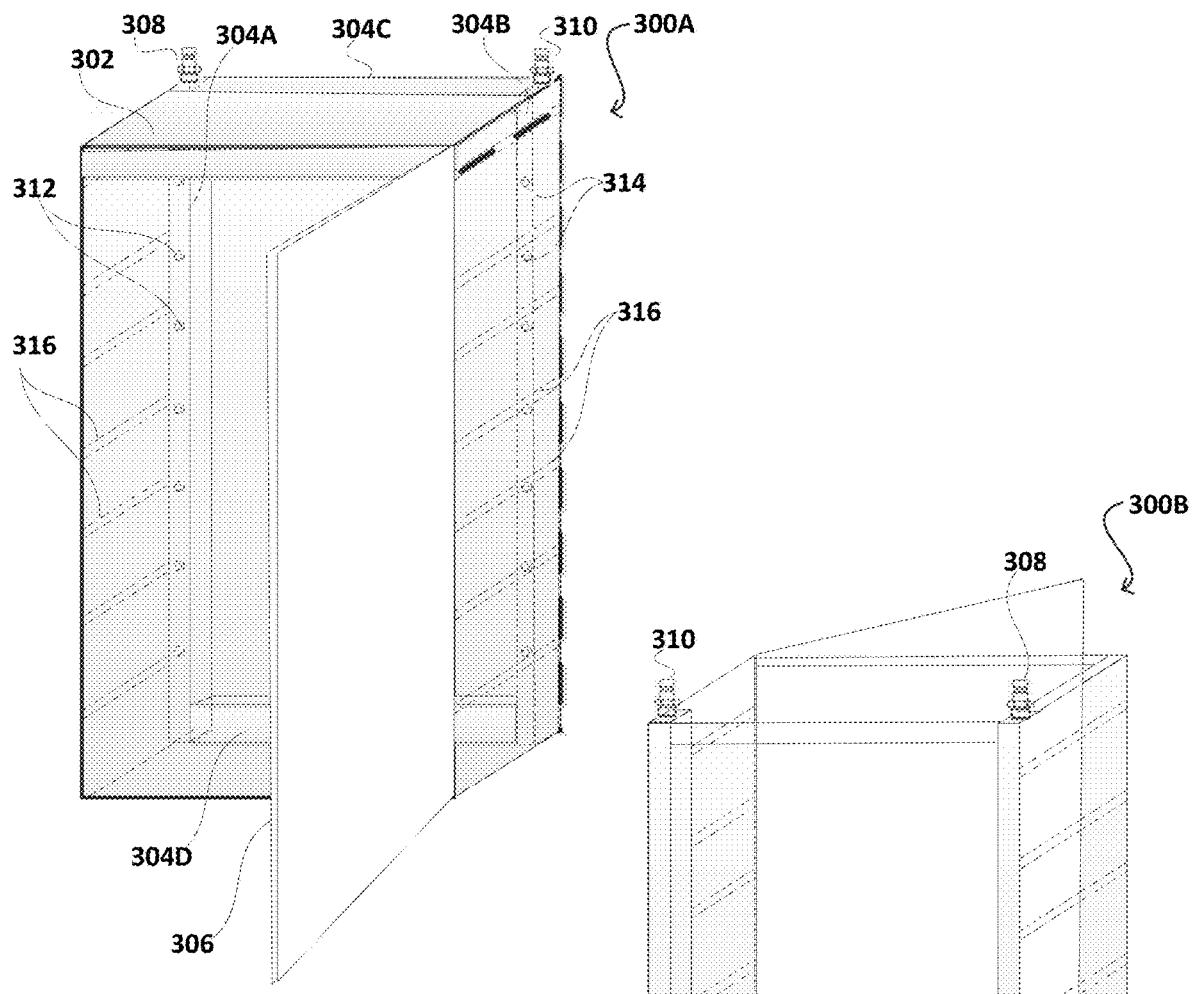
FIGS. 3A, 3B are different views of example racks incorporating at least a portion of the first cooling loop referenced in FIG. 2, according to at least one embodiment.
Figure 3B:
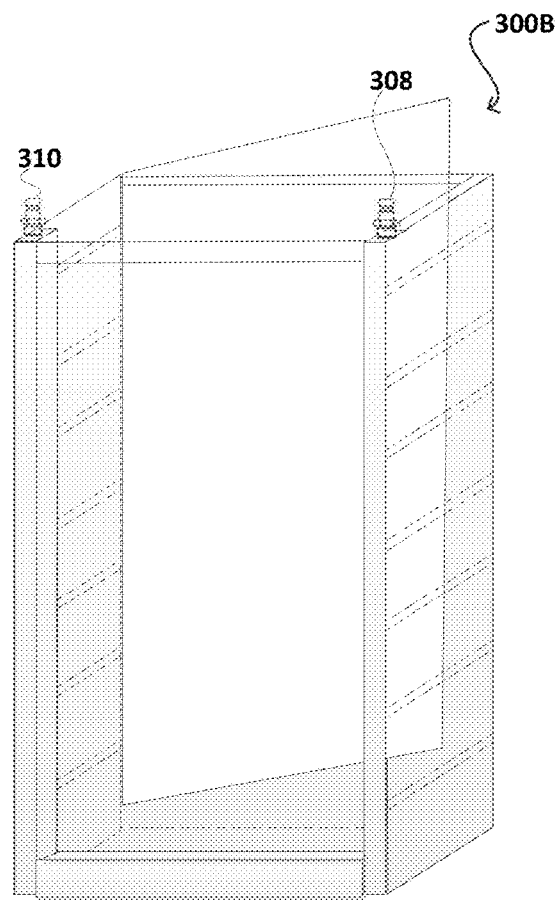

FIGS. 3A, 3B are different views of example racks 300A, 300B incorporating at least a portion of the first cooling loop referenced in FIG. 2, according to at least one embodiment. In at least one embodiment, with a room-level, a row-level, or a rack-level first cooling loop, the first coolant may pass all the way through to the server tray or the rack before existing as spent first coolant. However, as the first cooling loop utilizes a universal coolant, it may be required to determine the various computing components of each rack on a broad level to determine the appropriate topology of the cooling system to be applied. For instance, if the datacenter room has similar components throughout all the racks, a room-level first cooling system may be appropriate. When the datacenter room has similar components through a row of racks, then a rack-level first cooling loop may be appropriate. When the datacenter room has similar components in at least a rack, then the rack-level first cooling loop may be appropriate.

In an example, the rack 300A of FIG. 3A and the rack 300B of FIG. 3B may be a front view and a rear view, respectively, of a same rack. However, to illustrate that different types of racks are contemplated to work with the present disclosure, the racks 300A, 300B may not illustrate all the same features in the rear view and the front view. For instance, the mezzanine module 302 is not illustrated in the rear view rack 300B. The mezzanine module may include the heat exchanger (e.g., heat exchanger 218C). A front door 306 is illustrated for the rack 300A in FIG. 3A, but a door may not be required for the rack. Alternatively, in the interest of keeping a constant or proper reference temperature, an aspect of the present disclosure may use a door on both the front and the rear ends of the rack to retain a cooling effect. The rack 300A; 300B may be fully enclosed or maybe a frame structure that is stable enough to support various inserted trays or plates, for instance. In an example, rails or guides 316 are provided to receive trays or plates. The first cooling loop may include a loop within the rack 300A; 300B. In an example, a first main coupler 308 is provided at the rear of the rack 300A on a first rack cooling manifold 304A to receive the first coolant; and a second main coupler 310 is provided on a second rack cooling manifold 304B to return the first coolant after it is spent (e.g., absorbed heat from the computing components of the server tray in the rack 300A; 300B).

Even though, in at least one embodiment, such as illustrated in FIG. 2, the rack cooling manifold is located externally (e.g., illustrated as multiple tubing 214 with inlet for renewed or cooled coolant and outlet for spent coolant), the rack cooling manifolds may be internal to the rack. The example racks 300A; 300B illustrate such internal rack cooling manifolds. The present disclosure is applicable to flexible tubing 214 as well as to the rack cooling manifolds in FIGS. 3A, 3B. The first coolant travels through rack cooling manifolds 304A (side rack cooling manifold), 304D (lower rack cooling manifold), and 304B (side rack cooling manifold). The first coolant may exit the rack via second main coupler 310 at the rear of the rack 300A; 300B. Further, other pathways may be provided including an upper rack cooling manifold 304C.

In at least one embodiment, a mezzanine module 302 may be provided to slide within the rails or guides 316 at the very top or any other level of the rack 300A; 300B. The mezzanine module may include a cold plate or may include further couplers to distribute the first coolant within the rack 300A; 300B. In at least one embodiment, the mezzanine module is the only module of the rack receiving the first coolant. In such an embodiment, the mezzanine module, with its cold plate may be adapted to extract heat from the entire rack and pass the heat, via the first coolant, out of the rack. Further, first couplers 312 that are illustrated along the side rack cooling manifold 304A function as coolant inlet valves for server trays coupled thereon. Second couplers 314 that are illustrated along the side rack cooling manifold 304B function as exit valves for the server trays once coupled to the valves. As such, in operation as part of the first cooling loop, the first or universal coolant enters the rack 300A; 300B via the first main coupler 308, passes through a connected server tray, the bottom rack cooling manifold 304D, and/or the mezzanine module 302, and exits via the second main coupler 310.

Figure 3C:
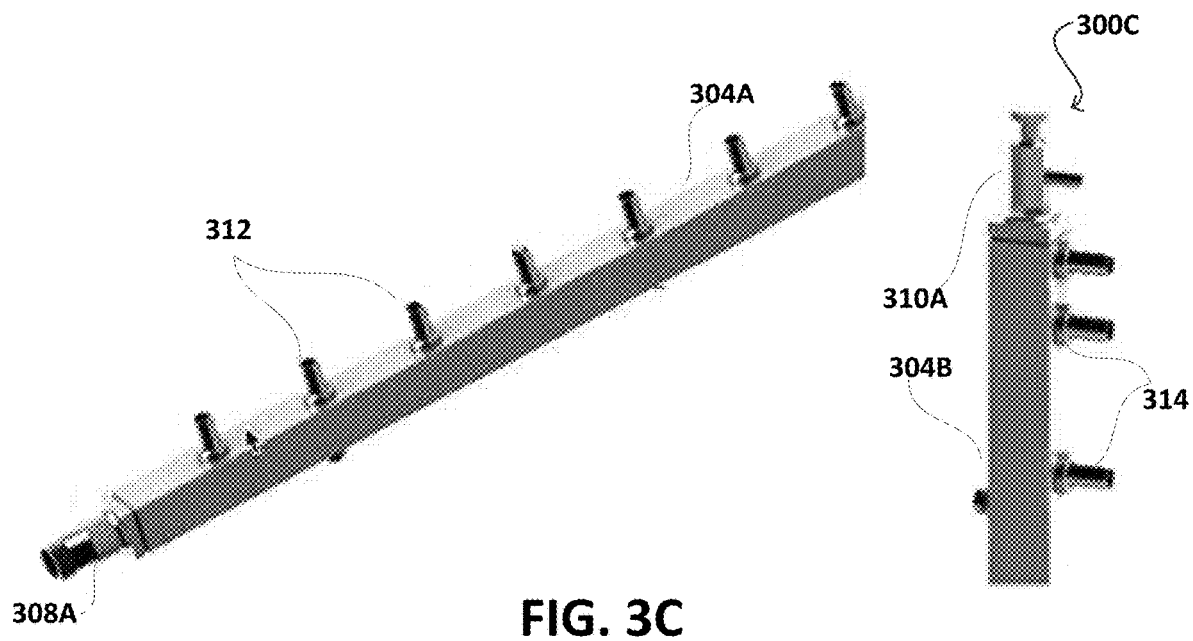
FIGS. 3C, 3D are detailed views of manifolds and coupling between the manifolds and trays or plates that may form at least a portion of the first cooling loop referenced in FIG. 2, according to at least one embodiment.
Figure 3D:
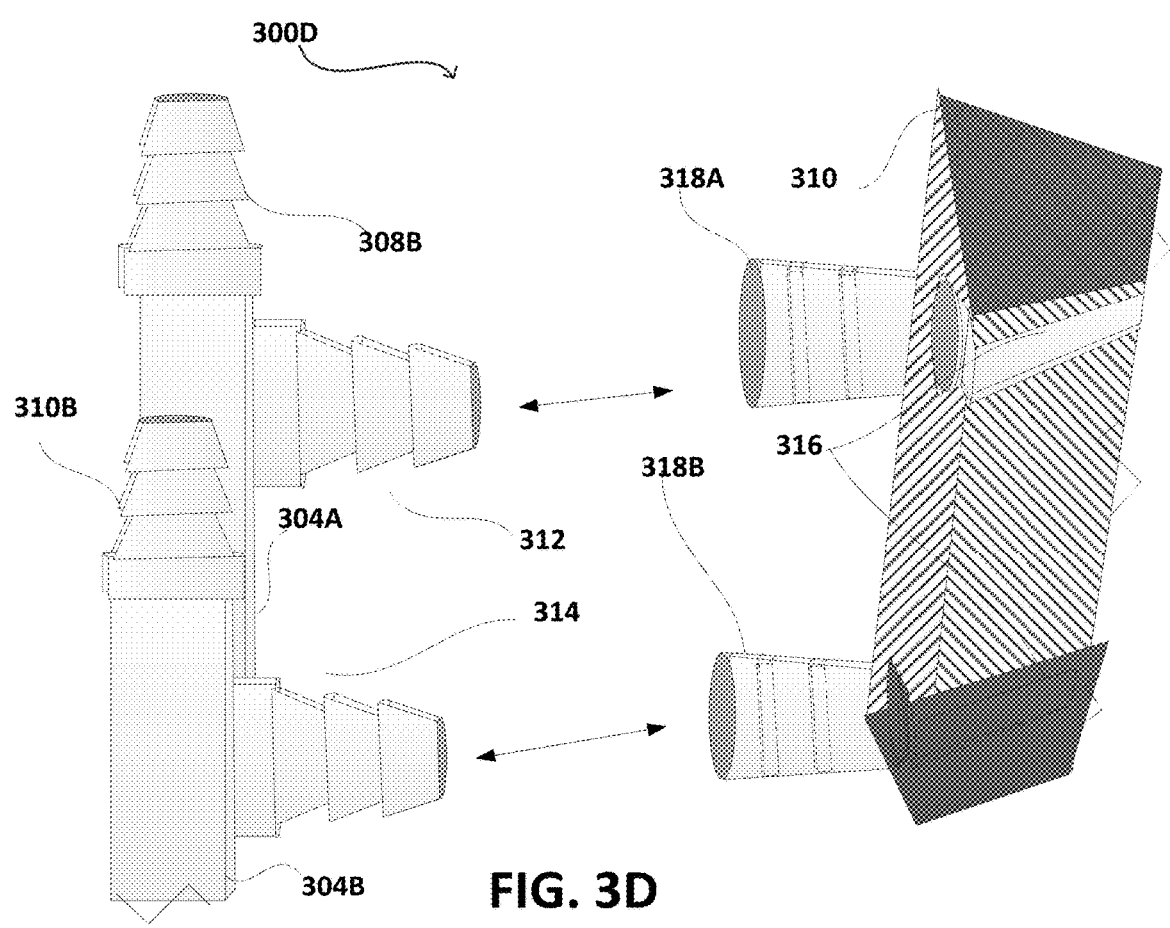

FIGS. 3C, 3D are detailed views of manifolds 300C and coupling 300D between the manifolds and trays or plates that may form at least a portion of the first cooling loop referenced in FIG. 2, according to at least one embodiment. The manifolds 300C may be side, lower, or upper rack cooling manifolds that are illustrated in the example racks 300A; 300B of FIGS. 3A, 3B. Each of the illustrated manifolds 304A; 304B may include distribution (either as inlet or exit) couplers 312, 314. Main couplers 308A, 310A are also illustrated with reference to the couplers 308, 310 of the example racks 300A; 300B of FIGS. 3A, 3B. The main couplers 308A, 310A are illustrated as screw-on couplers, but may be press-fit couplers, similar to the illustrated couplers of FIG. 3D. The distribution couplers 312, 314 may be press-fitted with mating couplers of server trays or plates. In at least one embodiment, the manifolds 304A, 304B are fixed to the rear portion of the example racks 300A; 300B of FIGS. 3A, 3B. The manifolds are also adapted to stay in position when the trays or plates are inserted along the rails or guides, as are illustrated in the example racks 300A; 300B of FIGS. 3A, 3B. When mating couplers of the trays or plates press against the distribution couplers 312, 314, a leak-proof press-fit is obtained. Then the first cooling loop enables passages of the first or universal coolant from the main coupler inlet 308A to the distribution coupler inlets 312, through a server or tray that is press-fitted against the respective one of the distribution couplers inlet 312, out of the distribution coupler outlet 314, and out of the main coupler outlet 310A. Further, the main coupler outlet 310A is illustrated as having a side coupler, which may be used to provide a connection to a neighboring rack or to provide a connection to a main coupler inlet 308A via the upper rack cooling manifold. The additional rack cooling manifolds may be used to prevent pressure build-up within the first cooling loop, for instance.

FIG. 3D illustrates the coupling 300D between the manifolds and trays or plates that may form at least a portion of the first cooling loop referenced in FIG. 2, according to at least one embodiment. The couplers 308A, 310A, 312, 314, 318 may include in-built non-return features. This enables one-way flow of fluid, so that no leak occurs when the coupling 300D is removed, for instance. This also enables the coupling 300D to cause immediate flow of the first or universal coolant from the row manifolds into the rack cooling manifold, and further to the server trays, the cooling plates, or the mezzanine modules. Alternatively, the couplers include a shut-off valve that may be activated to shut-off flow prior to removal of the trays or plates from within the rack. In at least one embodiment, FIG. 3D illustrates manifolds 304B, 304B with a main inlet coupler 308B and a main outlet coupler 310B. However, the main couplers 308B, 310B are distinguished from the main couplers 308A, 308B by requirements slightly different from press-fit. For example, the main couplers 308B, 310B may require a twist fit as these couplers may receive coolant from an existing tubing system. As such, the present disclosure is able to modify existing racks to function within existing datacenter architecture.

FIG. 3D also illustrates mating couplers 318 of a tray, cooling plate, or a mezzanine module 310. The tray, cooling plate, or a mezzanine module 310 may include narrow enclosed channels 316 to carry fluid from inlet manifold 304A in a loop, from an inlet mating coupler 318A to an outlet mating coupler 318B, and finally exiting via outlet manifold 304B. The enclosed channels enable the disclosed no-drip and quick-connection functions of the present disclosure by the press-fitting connections. When a server tray 310 is ready for use with the rack of the present disclosure, the server tray 310 is aligned in the previously-referenced rails or guides of the rack, and is pushed into the rack. The mating couplers 318A, 318B are also aligned with the inlet and outlet distribution couplers 312, 314 of the rack cooling manifolds 304A, 304B. Internal rubber or silicone seals along with ribs (as illustrated with dotted lines within the mating couplers 318A, 318B) may lock behind the notches on the press-fit inlet and outlet distribution couplers 312, 314. Non-return valves associated with each of the distribution couplers and the mating couplers are opened and coolant flows into the server tray 310.

Figure 4:
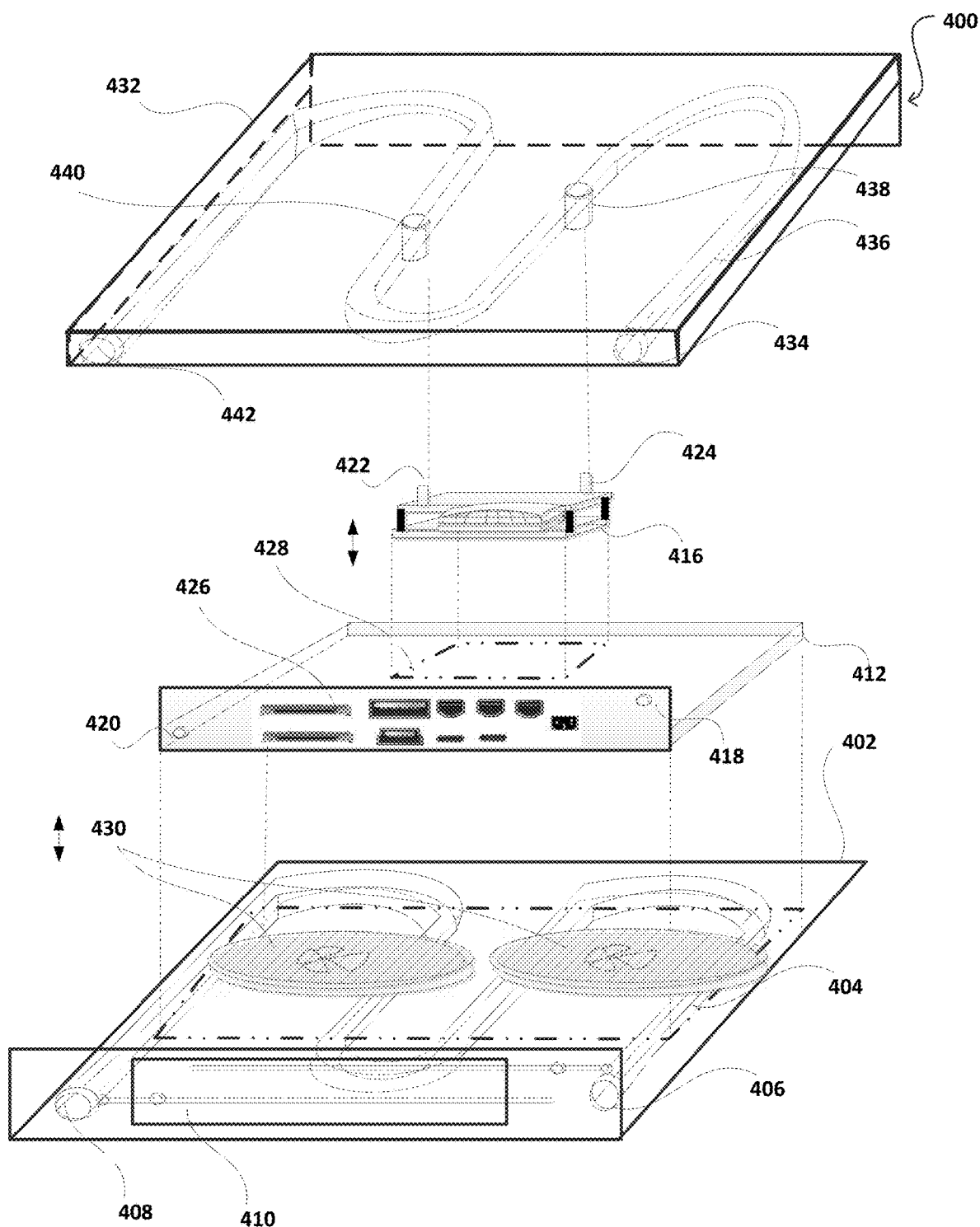
FIG. 4 is a feature diagram illustrating part of internal rack components of an example server tray or an example cooling plate, and an example computing component for cooling using the example cooling system in accordance with at least one embodiment.

FIG. 4 is a feature diagram illustrating parts of internal rack components 400 including an example server tray or an example cooling plate 402, 432 and an example computing component 412; 416 for cooling computing components 412; 416 using the example cooling system in accordance with at least one embodiment. In at least one embodiment, the computing components may be a circuit board or assembly 412 with connectors 426 or a singular computing component 416, such as a GPU. The circuit board 412 may include area 428 for an additional computing component, such as one or more GPUs or a CPUs 416. Further, the example server tray or the example cooling plate includes one or more of a bottom portion 402 and a top portion 432. When select circuit components are liquid cooled, inlet and outlet couplers 422, 424 may exist on the additional computing component 416. The inlet and outlet couplers 422, 424 enable distribution of coolant from the first cooling loop via inlet and outlet mating couplers 408, 406 of the server tray or cooling plate 402. The additional computing component may be plugged in and secured to the circuit board or assembly 412 in the area 428 provided. The circuit board or assembly 412 may itself include an inlet coupler 420 and an outlet coupler 418 for receiving and returning coolant from the first cooling loop. As such, the additional computing component 416 may couple to the mating couplers 408, 406 or may couple to the inlet or outlet couplers 420 418 of the circuit board or assembly 412.

In at least one embodiment, the server tray or cooling plate, either at the bottom portion 402 or the top portion 432, may include an enclosed channel 404; 436 (also illustrated channel 316 referenced in FIG. 3D) that may loop through the tray or plate. The enclosed channel 436 of the top portion 432 couples to the rack cooling manifold via server tray couplers (or mating couplers) 442, 434. Further, the enclosed channel 436 may be a tube within the server tray coupling to the rack cooling manifold, via server couplers 438, 440, to the computing component couplers 422, 424. The enclosed channel may be only on the top portion 432 and may be supported by fans 430 on the top portion instead of the bottom portion 402, but may exist on both portions as well. The enclosed channel of either portion of the server tray or cooling plate may provide cooling without requiring further tubing to the computing components or the additional computing components, via the couplers on the top portion coupling directly to couplers on the computing component or the additional computing components. However, both, the enclosed channel and the further coupling to the computing and additional computing components may exist concurrently. Fans 430 may exist when the tray 402 is a cooling plate. The fans 430 may provide additional forced air circulation for the coolant. The tray includes spacing 410 to accommodate the connectors 426.

Figure 5:
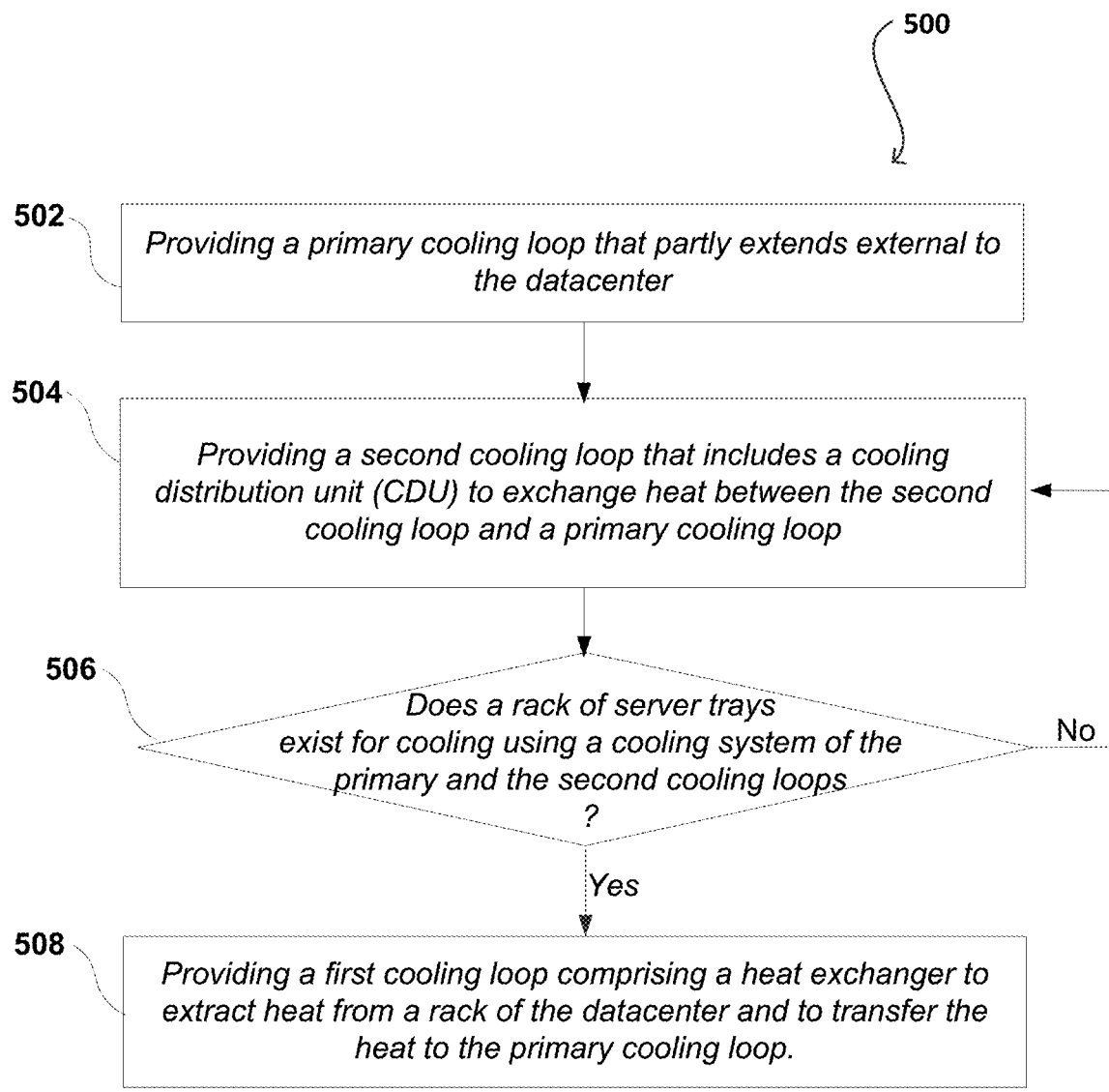
FIG. 5 is a process flow of steps available for a method of using or making the cooling system of FIGS. 2-4, according to at least one embodiment.

FIG. 5 is a process 500 flow of steps available for a method of using or making the cooling system of FIGS. 2-4, according to at least one embodiment. In at least one embodiment of the process 500, a sub-process 502 provides a cooling system with a primary cooling loop that partly extends external to the datacenter. Sub-process 504 provides a second cooling loop that includes the CDU. The CDU is used to exchange heat between the second cooling loop and the primary cooling cool. A determination may be made via sub-process 506 that a rack of server trays require cooling using the cooling system of the primary and the second cooling loops. For example, when it is determined that a computing component has been changed, and that a proprietary coolant is required for a new computing component, the present process may instead provide, via sub-process 508, a first cooling loop having a heat exchanger. The heat exchanger is used to extract heat from the rack of the datacenter and is used to transfer the heat to the primary cooling loop. The process 500 may be used with any rack or server tray having proprietary computing components, via at least the determination in sub-process 506 that a change has occurred, or the existing cooling system of sub-process 504 may be maintained if no change has occurred in the components. Alternatively, the process 500 may be applied to any datacenter to adapt an existing cooling system for universality.

Datacenter

Figure 6:
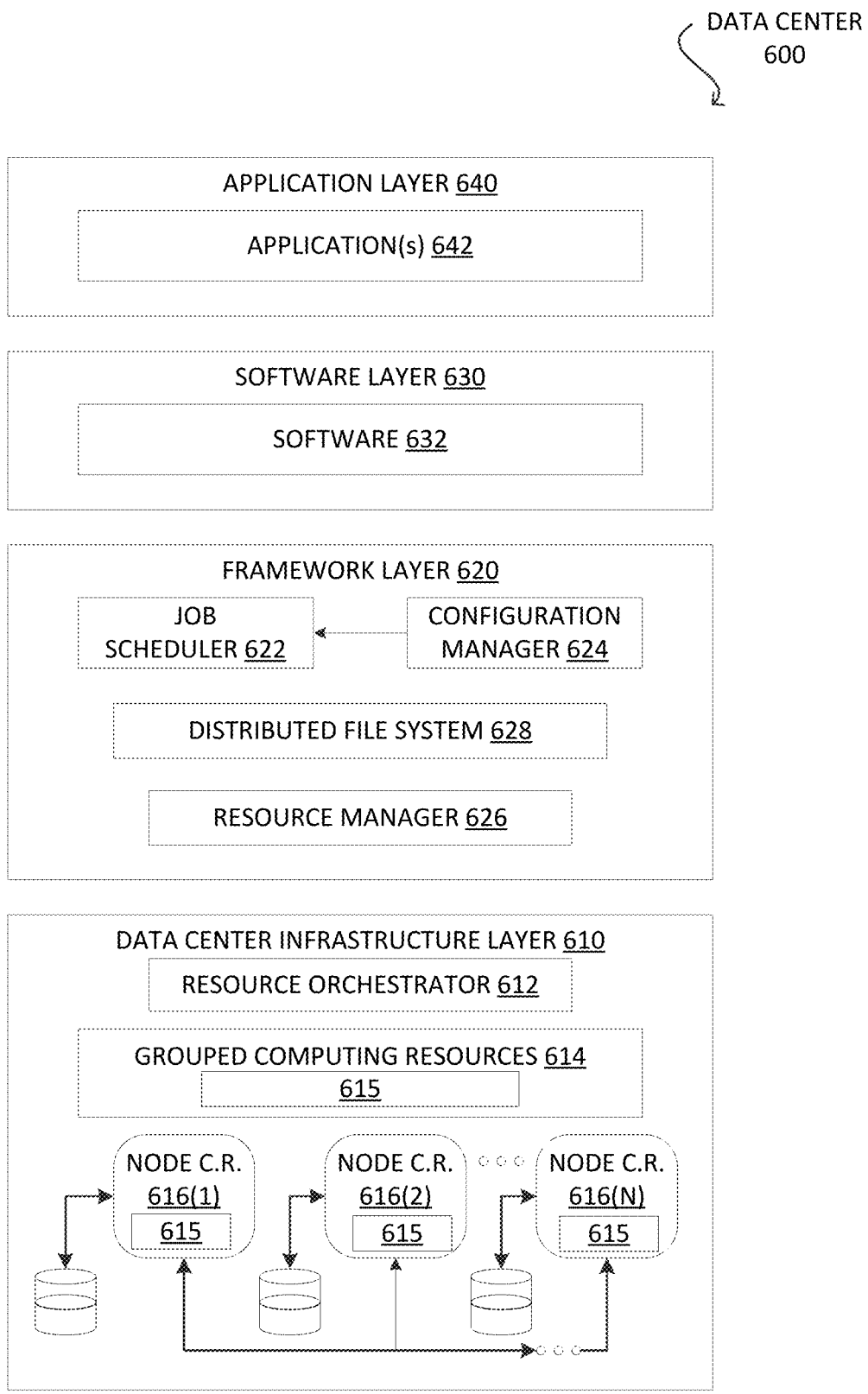
FIG. 6 illustrates an example datacenter, in which at least one embodiment from FIGS. 2-5 may be used.

FIG. 6 illustrates an example datacenter 600, in which at least one embodiment from FIGS. 2-5 may be used. In at least one embodiment, datacenter 600 includes a datacenter infrastructure layer 610, a framework layer 620, a software layer 630, and an application layer 640. In at least one embodiment, such as described in respect to FIG. 2, features in components 204-218C may be performed inside or in collaboration with the example datacenter 600. In at least one embodiment, the infrastructure layer 610, the framework layer 620, the software layer 630, and the application layer 640 may be partly or fully provided via computing components on server trays located in racks 210 of the datacenter 200. This enables cooling systems of the present disclosure to cool the computing components in an efficient and effective manner, reduces chances of leaks, and enables replacement of the computing components without downtime because of the universal coolant used in the first cooling loop 216A; 216B; 216C.

In at least one embodiment, as in FIG. 6, datacenter infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units ("CPUs") or other processors (including accelerators, field programmable gate arrays (FPGAs), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 616(1)-616(N) may be a server having one or more of above-mentioned computing resources. As such, these components 616(1)-616(N) may represent additional computing components that may receive the universal coolant as part of the first cooling loop.

In at least one embodiment, grouped computing resources 614 may include separate groupings of node C.R.s housed within one or more racks (not shown), or many racks housed in datacenters at various geographical locations (also not shown). Separate groupings of node C.R.s within grouped computing resources 614 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 612 may configure or otherwise control one or more node C.R.s 616(1)-616(N) and/or grouped computing resources 614. In at least one embodiment, resource orchestrator 612 may include a software design infrastructure ("SDI") management entity for datacenter 600. In at least one embodiment, resource orchestrator may include hardware, software or some combination thereof.

In at least one embodiment, as shown in FIG. 6, framework layer 620 includes a job scheduler 622, a configuration manager 624, a resource manager 626 and a distributed file system 628. In at least one embodiment, framework layer 620 may include a framework to support software 632 of software layer 630 and/or one or more application(s) 642 of application layer 640. In at least one embodiment, software 632 or application(s) 642 may respectively include web-based service software or applications, such as those provided by Amazon Web Services, Google Cloud and Microsoft Azure. In at least one embodiment, framework layer 620 may be, but is not limited to, a type of free and open-source software web application framework such as Apache Spark™ (hereinafter "Spark") that may utilize distributed file system 628 for large-scale data processing (e.g., "big data"). In at least one embodiment, job scheduler 622 may include a Spark driver to facilitate scheduling of workloads supported by various layers of datacenter 600. In at least one embodiment, configuration manager 624 may be capable of configuring different layers such as software layer 630 and framework layer 620 including Spark and distributed file system 628 for supporting large-scale data processing. In at least one embodiment, resource manager 626 may be capable of managing clustered or grouped computing resources mapped to or allocated for support of distributed file system 628 and job scheduler 622. In at least one embodiment, clustered or grouped computing resources may include grouped computing resource 614 at datacenter infrastructure layer 610. In at least one embodiment, resource manager 626 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 628 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 628 of framework layer 620. One or more types of applications may include, but are not limited to, any number of a genomics application, a cognitive compute, and a machine learning application, including training or inferencing software, machine learning framework software (e.g., PyTorch, TensorFlow, Caffe, etc.) or other machine learning applications used in conjunction with one or more embodiments.

In at least one embodiment, datacenter 600 may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "including," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of a set (e.g., a set of items) or subset, unless otherwise noted or contradicted by context, is to be construed as a nonempty collection including one or more members. Further, unless otherwise noted or contradicted by context, a subset of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language may not be intended to imply that certain embodiments require at least one of A, at least one of B, and at least one of C each to be present. In addition, unless otherwise noted or contradicted by context, a plurality indicates a state of being plural (e.g., a plurality of items indicates multiple items). A plurality is at least two items, but can be more when so indicated either explicitly or by context. Further, unless stated otherwise or otherwise clear from context, based on means based at least in part on and not based solely on.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification, references to processing, computing, calculating, determining, or the like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, a processor may refer to any device or portion of a device that processes electronic data from registers and/or memory and transform that electronic data into other electronic data that may be stored in registers and/or memory. As non-limiting examples, "processor" may be a CPU or a GPU. A "computing platform" may include one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A datacenter cooling system, comprising:
a first cooling loop comprising a heat exchanger and a cooling manifold to be coupled to a plurality of servers, the heat exchanger to exchange heat between the first cooling loop and a second cooling loop that comprises a cooling distribution unit (CDU), the CDU to exchange heat between the second cooling loop and a primary cooling loop, the primary cooling loop to exit a datacenter to dissipate heat to an external cooling medium.

2. The datacenter cooling system of claim 1, further comprising:
a first coolant in the first cooling loop, the first coolant independent of a second coolant in the second cooling loop and a third coolant in the primary cooling loop.

3. The datacenter cooling system of claim 1, further comprising:
a module comprising the first cooling loop for assembly within a rack of the datacenter and comprising fluid couplers to couple with the second cooling loop and to couple with one or more server trays of the rack.

4. The datacenter cooling system of claim 1, further comprising:
the fluid couplers adapted to receive at least one mating coupler from the one or more server trays or from the second cooling loop by a snap-in connection.

5. The datacenter cooling system of claim 1, wherein a first coolant in the first cooling loop is water and wherein a second coolant in the second cooling loop and a primary coolant in the primary cooling loop are both a dielectric fluid alone or a dielectric fluid with a water component.

6. The datacenter cooling system of claim 1, further comprising:
a cooling plate for insertion within a rack of the datacenter and for coupling with the first cooling loop, the cooling plate to receive a coolant and to provide a path for the coolant to exit back into the first cooling loop.

7. The datacenter cooling system of claim 6, further comprising:
an area associated with the cooling plate for comprising computing components of the datacenter or for comprising at least one server tray.

8. The datacenter cooling system of claim 1, further comprising:
secondary couplers of one or more server trays or of a cooling plate located within a rack of the datacenter, the secondary couplers for receiving coolant from the first cooling loop, for passing the coolant through the cooling plate that is associated with one or more computing components, and for returning the coolant to the first cooling loop.

9. The datacenter cooling system of claim 1, wherein the heat exchanger is located external or internal to a rack of the datacenter and wherein the first cooling loop is adapted to draw heat from within the rack to the second cooling loop external to the rack.

10. The datacenter cooling system of claim 1, wherein the primary cooling loop interfaces with a cooling tower that enables dissipation of the heat transferred from the first cooling loop to the second cooling loop using the external cooling medium.

11. A method of cooling a datacenter, comprising:
providing a primary cooling loop that partly extends external to the datacenter to dissipate heat to an external cooling medium;
providing a second cooling loop that comprises a cooling distribution unit (CDU), the CDU to exchange heat between the second cooling loop and a primary cooling loop; and
providing a first cooling loop comprising a heat exchanger and a cooling manifold to be coupled to a plurality of servers, the heat exchanger the heat exchanger to exchange heat between the first cooling loop and the second cooling loop.

12. The method of claim 11, further comprising:
providing a first coolant in the first cooling loop, the first coolant independent of a second coolant in the second cooling loop and a third coolant in the primary cooling loop.

13. The method of claim 11, further comprising:
assembling a module comprising the first cooling loop within a rack of the datacenter; and
coupling fluid couplers in the first cooling loop with the second cooling loop and with one or more server trays of the rack.

14. The method of claim 11, further comprising:
adapting the fluid couplers to receive at least one mating coupler from the one or more server trays or the second cooling loop by a snap-in connection.

15. The method of claim 11, further comprising, wherein a first coolant in the first cooling loop is water and wherein a second coolant in the second cooling loop and a primary coolant in the primary cooling loops are both a dielectric fluid alone or a dielectric fluid with a water component.

16. The method of claim 11, further comprising:
inserting a cooling plate within a rack of the datacenter; and
coupling the cooling plate with the first cooling loop, the cooling plate to receive a coolant and to provide a path for the coolant to exit back into the first cooling loop.

17. The method of claim 16, further comprising:
providing an area associated with the cooling plate for comprising computing components of the datacenter or for comprising at least one server tray.

18. The method of claim 11, further comprising:
enabling secondary couplers of one or more server trays or of a cooling plate located within a rack of the datacenter to receive coolant from the first cooling loop;
enabling the coolant to pass through the cooling plate; and
returning the coolant to the first cooling loop.

19. The method of claim 11, further comprising:
positioning the heat exchanger external or internal to a rack of the datacenter; and
adapting the first cooling loop to draw heat from within the rack to the second cooling loop external to the rack.

20. The method of claim 11, further comprising:
enabling the primary cooling loop to interface with a cooling tower that enables dissipation of the heat transferred from the first cooling loop to the second cooling loop using the external cooling medium.

* * * * *